ns">

United States Patent [19]
Wu

[11] Patent Number: 5,907,782
[45] Date of Patent: May 25, 1999

[54] METHOD OF FORMING A MULTIPLE FIN-PILLAR CAPACITOR FOR A HIGH DENSITY DRAM CELL

[75] Inventor: Shye-Lin Wu, Hsinchu, Taiwan

[73] Assignee: Acer Semiconductor Manufacturing Inc., Hsinchu, Taiwan

[21] Appl. No.: 09/134,885

[22] Filed: Aug. 15, 1998

[51] Int. Cl.[6] .................................................. H01L 21/20
[52] U.S. Cl. ........................ 438/398; 438/396; 438/253; 438/255
[58] Field of Search .................................... 438/239, 240, 438/253, 254, 255, 256, 260, 396, 397, 398, 399, 964; 257/303, 304, 306, 309, 310

[56] References Cited

U.S. PATENT DOCUMENTS

| | | | |
|---|---|---|---|
| 5,155,657 | 10/1992 | Oehrlein et al. | 438/397 |
| 5,459,095 | 10/1995 | Huang et al. | 438/396 |
| 5,532,182 | 7/1996 | Woo | 438/254 |
| 5,677,222 | 10/1997 | Tseng | 438/254 |
| 5,770,499 | 6/1998 | Kwok et al. | 438/254 |
| 5,817,553 | 10/1998 | Stengl et al. | 438/254 |
| 5,817,554 | 10/1998 | Tseng | 438/255 |
| 5,834,357 | 11/1998 | Kang | 438/253 |
| 5,843,822 | 12/1998 | Hsia et al. | 438/254 |

*Primary Examiner*—Charles Bowers
*Assistant Examiner*—Jack Chen

*Attorney, Agent, or Firm*—Harness, Dickey & Pierce, P.L.C.

[57] ABSTRACT

The present invention is a method of manufacturing a high density capacitor for use in semiconductor memories. High etching selectivity between BPSG (borophosphosilicate glass) and CVD-oxide (chemical vapor deposition oxide) is used to fabricate a capacitor with a plurality of horizontal fins. First, a nitride layer is formed on a semiconductor substrate. A stacked layer consists of BPSG and silicon oxide formed on the nitride layer. Then a contact hole is formed in the stacked layer and the nitride layer. A highly selective etching is then used to etch the BPSG sublayers of the stacked layer. Next, a first polysilicon layer is formed in the contact hole and the stacked layer, subsequently, a dielectric layer is formed on the first polysilicon layer. Then, undoped hemispherical-grain silicon (HSG—Si) is formed on the dielectric layer. Next, a portion of the dielectric layer is etched using the HSG—Si layer as a hard mask to expose a portion of the first polysilicon layer. A second polysilicon layer is formed on the HSG—Si layer and the exposed first polysilicon layer. An etching back or CMP is used for planarization. Then photolithography and etching process is used to define the storage node. Next the stacked layer is removed by BOE solution. A dielectric film is then formed along the surface of the first and second polysilicon layer. Finally, a third polysilicon layer is formed on the dielectric film. Thus, a capacitor with multiple horizontal fins and vertical pillars is formed.

29 Claims, 7 Drawing Sheets

METHOD OF FORMING A MULTIPLE FIN-PILLAR CAPACITOR FOR A HIGH DENSITY DRAM CELL

FIELD OF THE INVENTION

The present invention relates to a method of forming a dynamic random access memory (DRAM) cell, and more particularly to a method for forming an improved capacitor of a DRAM cell.

BACKGROUND OF THE INVENTION

A memory cell of a semiconductor DRAM typically consists of a storage capacitor and an access transistor. One terminal of the capacitor is connected to the source or the drain of the transistor. The other terminal and the gate electrode of the transistor are connected to external connection lines, which are known as the bit line and the word line, respectively. The other terminal of the capacitor is connected to a reference voltage. Thus, the formation of a DRAM cell comprises the formation of a transistor, the formation of a capacitor, the formation of the contacts to the capacitor and the formation of the connection lines.

In recent years, the development of the semiconductor memory device become highly integrated and highly packing density, the area occupied by a capacitor of a DRAM storage cell shrinks, thus decreasing the capacitance of the capacitor owing to its smaller electrode surface area. However, a relatively large capacitance is required to achieve a high signal-to-noise radiation in reading the memory cell and to reduce soft errors (due to alpha particle interference). Therefore, it is desirable to reduce the cell dimension and yet obtain a high capacitance, which achieves both high cell integration and reliable operation.

The capacitor type that is most typically used in DRAM memory cells is planar capacitor, which is relatively simple to manufacture. For very small memory cells, planar capacitor becomes very difficult to use reliably. One approach for increasing the capacitance while maintaining the high integration of the memory cells is directed toward the shape of the capacitor electrodes. In this approach, the polysilicon layer implementing the capacitor electrodes may have protrusions, cavities, fins, etc., to increasing the surface area of the capacitor electrode, so that increases its capacitance while maintaining the small area occupied on the substrate surface. In addition, capacitors with hemispherical-grain (HSG) polysilicon storage nodes and crown structure have been used in the manufacture of DRAM. The HSG polysilicon storage node increases the surface area of the capacitor, so that increases the capacitance. Increasing the height of stacked cells can also increase the capacitance of a stacked capacitor without increasing the planar area of the capacitor. Reducing the thickness of the dielectric also can improve the capacitance of the capacitor, but this approach is limited because of yield and reliability problems.

A capacitor-over-bit-line (COB) cell with a hemispherical-grain (HSG) polysilicon storage node has been developed (see "A CAPACITOR-OVER-BIT-LINE (COB) CELL WITH A HEMISPHERICAL-GRAIN STORGE NODE FOR 64 Mb DRAMs", M. Sakao etc. microelectronics research laboratories, NEC Corporation). The HSG—Si is deposited by low-pressure chemical vapor deposition method at the transition temperature from amorphous-Si to polycrystalline-Si. Further, a cylindrical capacitor using hemispherical-grained Si have been proposed (see "A NEW CYLIDRICAL CAPACITOR USING HEMISPHERICAL GRAINED Si (HSG—Si) FOR 256 Mb DRAMs", H. Watanabe et al., Tech Dig, December 1992, pp. 259–262).

When the dimension of DRAM is close to deep-submicron, a new method for manufacturing small capacitors is needed. A method to fabricate a multiple fin-pillar capacitor using a hemispherical-grained silicon is needed.

SUMMARY OF THE INVENTION

The object of the present invention is to provide a method for forming a high density DRAM capacitor that increases the capacitance of a capacitor electrode.

A first dielectric layer for isolation is formed on a semiconductor substrate with a MOSFET conventionally formed on and in the substrate. A silicon nitride layer is then formed on the first dielectric layer. A stacked layer consisting of alternating BPSG layers and silicon dioxide layers is formed on the silicon nitride layer. The stacked layer is formed on the silicon nitride layer repeatedly by deposition.

A contact hole is formed by well-known technology. Next, a highly selective etching process is then used to remove a portion of the BPSG layers. In preferred embodiment, the selective etching step utilizes a low pressure HF vapor to selectively etch the BPSG layers and silicon dioxide layers. The relative susceptibility to etching of the BPSG layers to the silicon dioxide layers is about 2000 to 1. A first conductive layer is then deposited over the stacked layer so as to fill the contact hole.

A second dielectric layer is formed on the first conductive layer. An undoped hemispherical-grain silicon (HSG—Si) is then formed on the second dielectric layer. The HSG—Si is separated along the grain boundaries to expose a portion of the second dielectric layer. Next, the exposed second dielectric layer is etched using the HSG—Si layer as a hard mask to expose a portion of the first polysilicon layer. A second conductive layer is formed on the HSG—Si layer and the exposed first conductive layer. An etching back or CMP is used for planarization. Next, a photoresist is patterned on the second conductive layer to define the storage node. An etching is used to etch the stacked layer, the polysilicon layers, and the dielectric layer. Then the photoresist is removed away.

Next, the BPSG layers and the silicon dioxide layers are removed to form a plurality of horizontal fins and a plurality of vertical pillars. The next step of the formation is to deposit a dielectric film along the surface of the first conductive layers, and the second conductive layers. A third conductive layer is deposited over the dielectric film.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

The present invention relates to a method of making a high density memory cell for DRAM, which has an enlarged surface area of the capacitor to increase the performance of the memory cell. Further, the present invention uses high etching selectivity (higher than 2000:1) between BPSG (borophosphosilicate glass) and CVD silicon dioxide to form multi-fin capacitor. As will be seen below, this technique can be used to create a multiple fins/pillars capacitor. The detailed processes will be described as follows.

Figure 1:
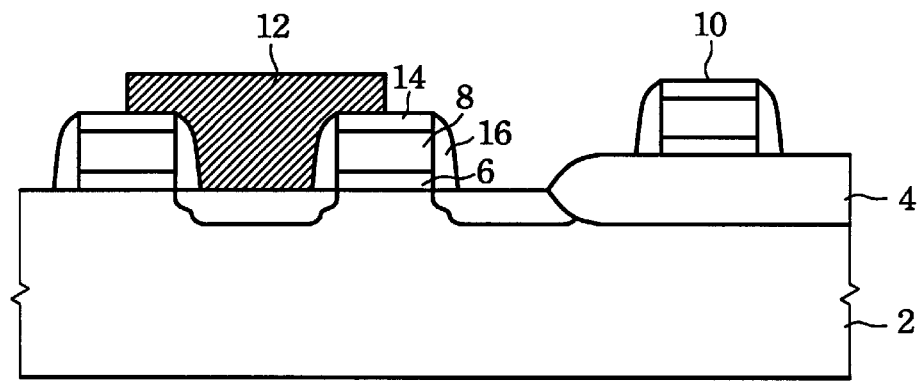
FIG. 1 is a cross-sectional view of a semiconductor wafer illustrating the step of forming a gate structure on a semiconductor substrate.

Referring to FIG. 1, a single crystal P-type substrate 2 with a <100>crystallographic orientation is used for the preferred embodiment. A thick field oxide region 4, FOX, is created for the purposes of isolation. The FOX region 4 is created via photolithography and dry etching steps to etch a silicon nitride-silicon dioxide stacked layer. After the photoresist is removed and wet cleaned, a thermal oxidation in an oxygen-steam ambient is used to form the FOX 4 region.

Initially, a silicon dioxide layer 6 is created atop the substrate 2 to use as a gate oxide. In the preferred embodiment, the silicon dioxide layer 6 is formed by using an oxygen-steam ambient, at a temperature between about 750 to 1100° C. Alternatively, the gate oxide 6 may be formed using other known oxide chemical compositions and procedures. After the first silicon dioxide layer 6 is formed, a polysilicon layer 8 is formed over the silicon dioxide layer 6 and the field oxide regions 4. In the preferred embodiment, the polysilicon layer 8 is formed by conventional chemical vapor deposition (CVD). Then, a word line 10, a bit line 12, gate structures with cap layer 14, and side wall spacers 16, are formed by well known technology and is not particularly germane to the present invention.

Figure 2:
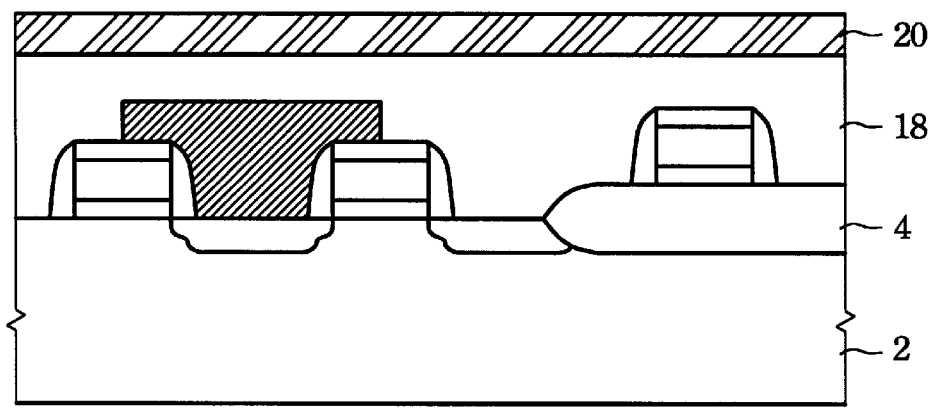
FIG. 2 is a cross-sectional view of a semiconductor wafer illustrating the step of forming a first dielectric layer and a nitride layer on the semiconductor substrate.

As shown in FIG. 2, a dielectric layer 18 for isolation is formed on the gate structures, FOX 4 and substrate 2 to a thickness about 2000 to 10000 angstroms. The dielectric layer 18 is preferably formed of CVD silicon oxide. A nitride layer 20 is subsequently formed on the dielectric layer 18. The nitride layer 20 is used as an etching barrier to prevent the dielectric layer 18 from etching for later process. The nitride layer 20 has a thickness at a range about 300 to 2000 angstroms.

Figure 3:
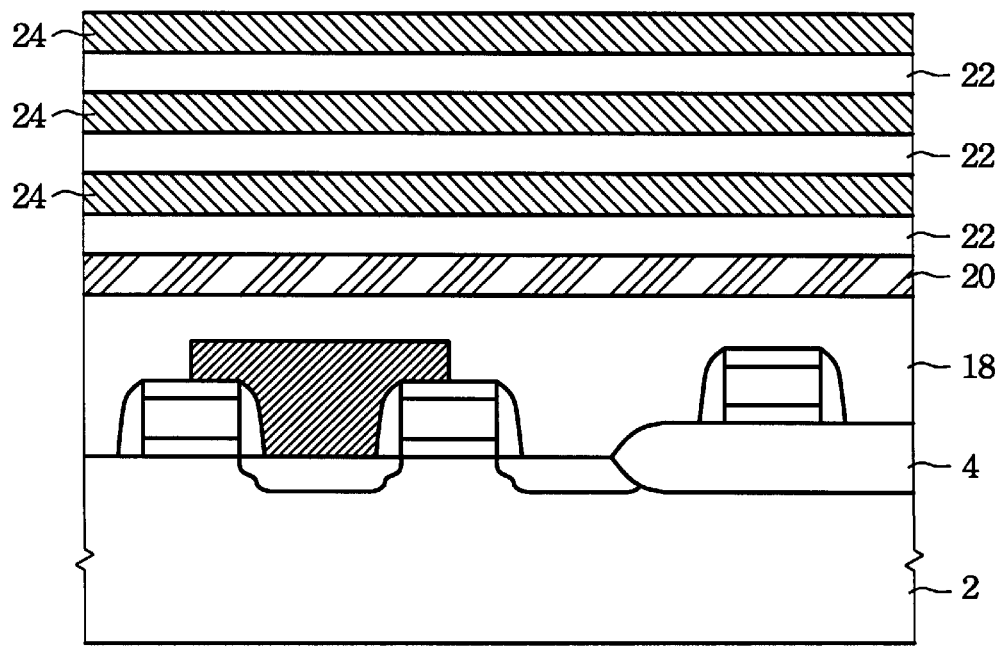
FIG. 3 is a cross-sectional view of a semiconductor wafer illustrating the step of forming a stacked layer consisting of alternating BPSG (borophosphosilicate glass) layers and CVD-oxide (chemical vapor deposition oxide) layers on the nitride layer.

Turning next to FIG. 3, a stacked layer consisting of alternating BPSG layers 22 and silicon dioxide layers 24 is formed on the nitride layer 20. The stacked layer is formed on the nitride layer 20 repeatedly by deposition. The BPSG layers 22 can be formed by low pressure chemical vapor deposition using tetraethylorthosilicate (TEOS) as a reactant. Boron and phosphorus are added during the formation of the borophosphosilicate glass layer. The thickness of the BPSG layers is 300 to 2000 angstroms. The silicon dioxide layers 24 can be formed by any suitable process such as chemical vapor deposition process, using TEOS as a source at a temperature between about 450 to 800° C., and to a thickness about 300 to 2000 angstroms.

Figure 4:
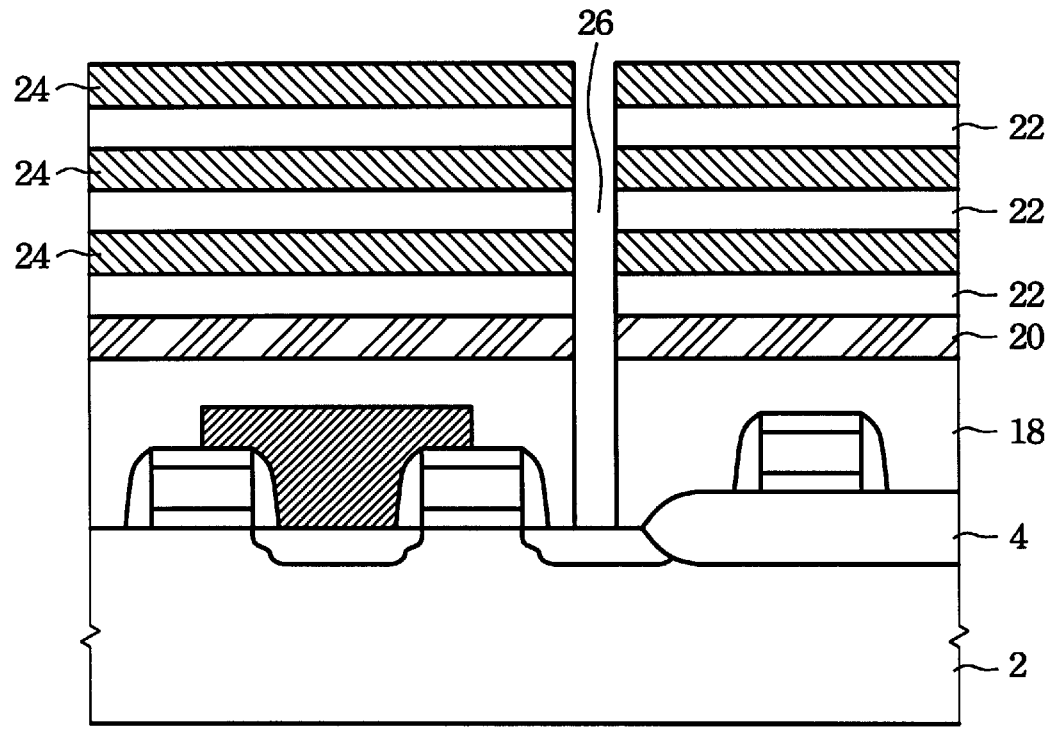
FIG. 4 is a cross-sectional view of a semiconductor wafer illustrating the step of forming a contact hole in the stacked layer, nitride layer and in the first dielectric layer.

Turning next to FIG. 4, a first photoresist is pattern on the stacked layer to expose a region where will be generated a contact hole for subsequent process. Then an etching is used to etch the stacked layer, the nitride layer 20 and the dielectric layer 18 back until the substrate is reached to form a contact hole 26. In this embodiment, a plasma etching is performed to create the contact hole 26 for storage node contact. The etchant to remove oxide is selected from the group of $CCl_2F_2$, $CH_2F_2/CF_4$, $CHF_3/O_2$, $CH_3CH_2F$, $CF_4/O_2$, while the nitride layer is removed by using $CF_4/H_2$, $CHF_3$ or $CH_3CHF_2$. By controlling the recipe of the reaction gas the stacked layer, the nitride layer 20 and the dielectric layer 18 will be etched away respectively. Then the first photoresist is stripped away.

Figure 5:
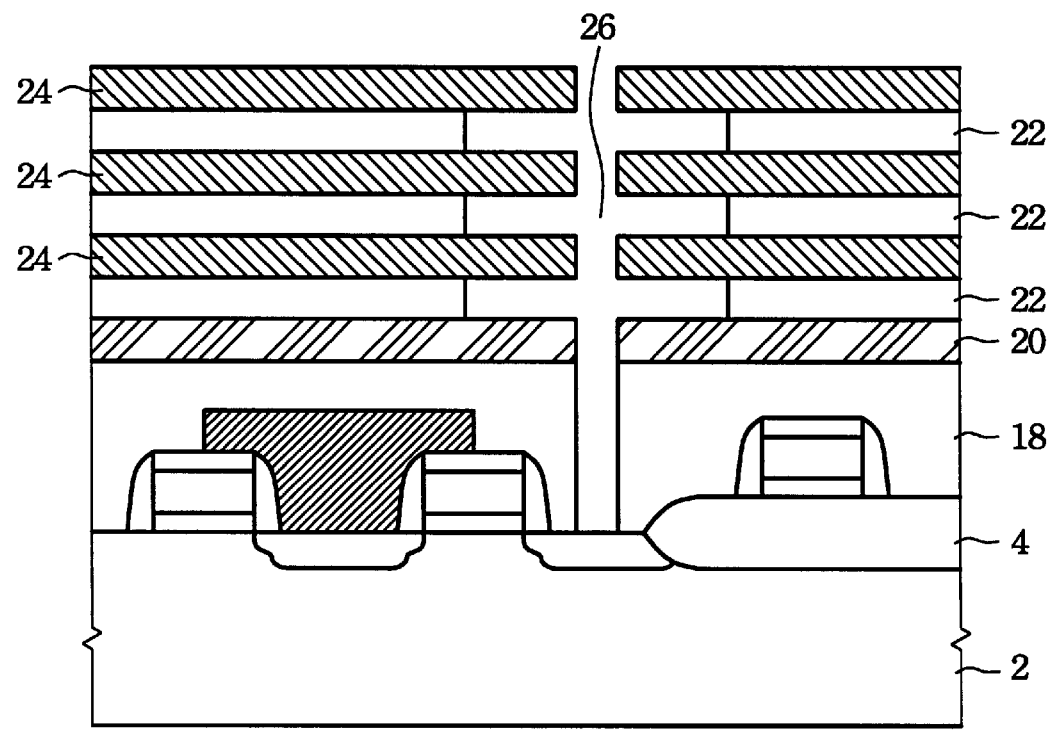
FIG. 5 is a cross-sectional view of a semiconductor wafer illustrating the step of selectively etching the BPSG layers of the stacked layer.

Next, referring to FIG. 5, a highly selective etching process is then used to remove a portion of the BPSG layers 22. An important key of the present invention is that the etching rate of BPSG is much greater than that of silicon dioxide. In preferred embodiment, the selective etching step utilizes a low pressure HF vapor to selectively etch the BPSG layers 22 and silicon dioxide layers 24. The relative susceptibility to etching of the BPSG layers 22 to the silicon dioxide layers 24 is about 2000 to 1. In addition, the susceptibility of BPSG to etching is also much greater than that of BSG, thus the BSG layer can be used to replace the silicon dioxide layer. Therefore, the BPSG layers 22 are etched away much more significantly than the silicon dioxide layers 24.

Figure 6:
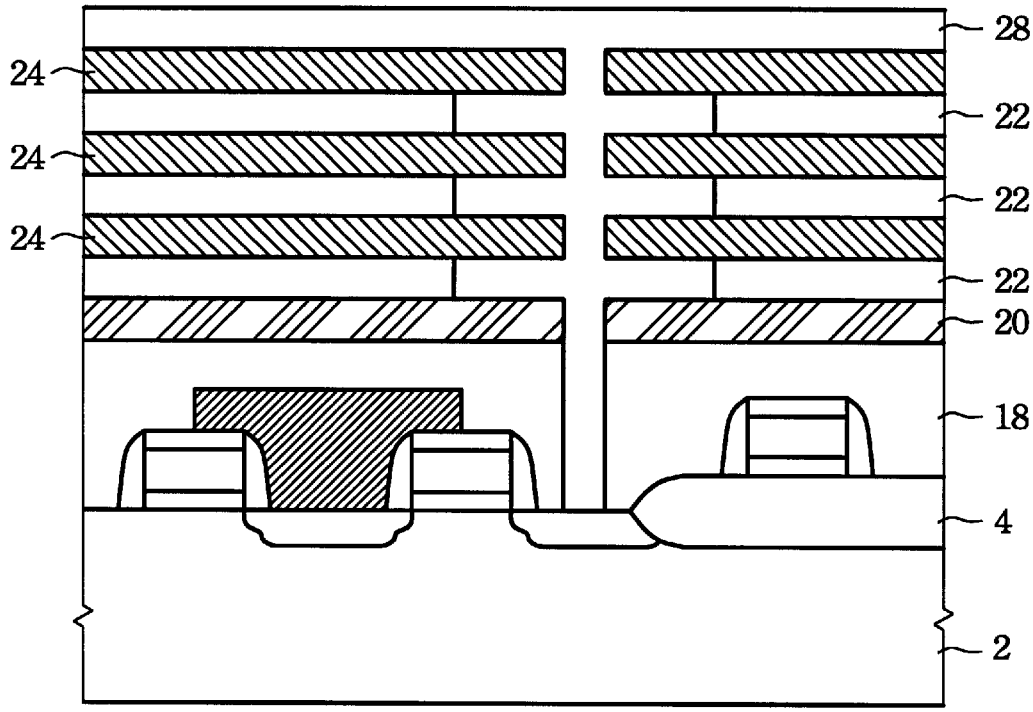
FIG. 6 is a cross-sectional view of a semiconductor wafer illustrating the step of forming a first conductive layer on the stacked layer.

Referring to FIG. 6, a first conductive layer 28 is deposited using a conventional process over the stacked layer and the first conductive layer 28 is also formed between the BPSG layers 22 and the silicon dioxide layers 24. In this embodiment, the first conductive layer 28 has a thickness between 300 to 5000 angstroms. Preferably, the first conductive layer 28 can be chosen from doped polysilicon, in-situ doped polysilicon, aluminum, copper, tungsten, titanium, silicide, PtSi, $WSi_2$, $TiSi_2$ or $CoSi_2$.

Figure 7:
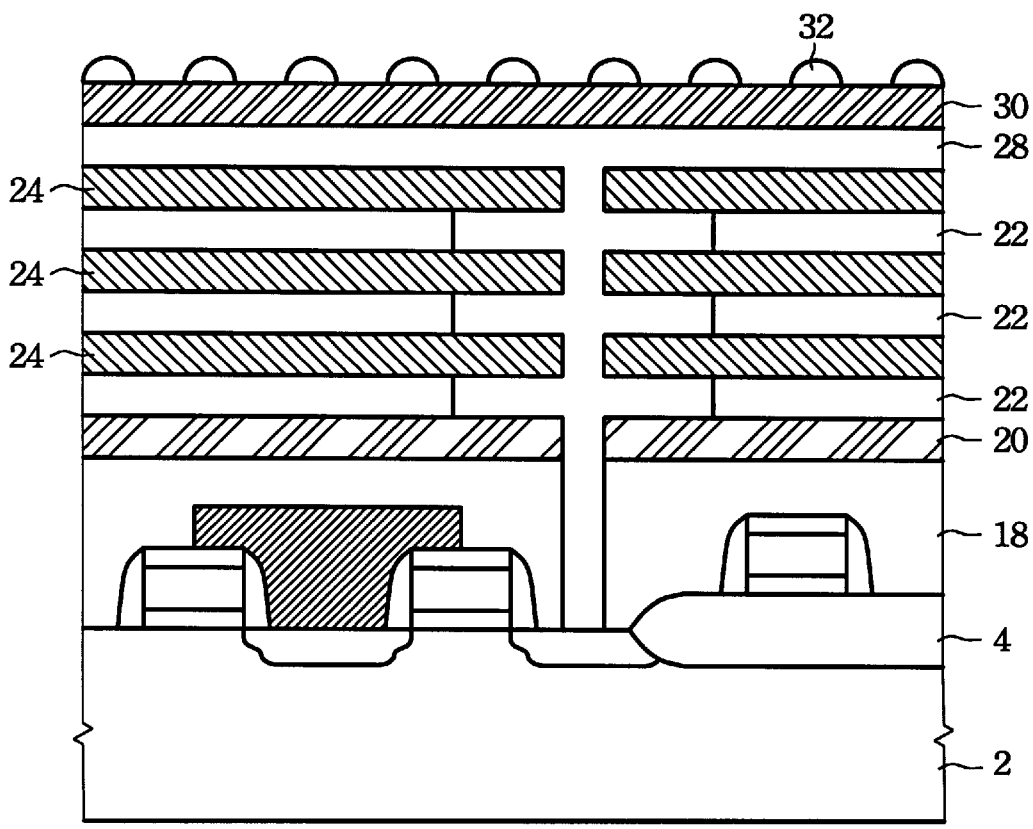
FIG. 7 is a cross-sectional view of a semiconductor wafer illustrating the step of forming a second dielectric layer and an undoped hemispherical grained silicon (HSG—Si) on the first conductive layer.

Turning next to FIG. 7, a second dielectric layer 30 is formed on the first conductive layer 28 having a thickness about 500 to 3000 angstroms. Preferably, the second dielectric layer 30 can be chosen from BPSG, TEOS-oxide, or SOG. An undoped hemispherical-grain silicon (HSG—Si) 32 is then formed on the second dielectric layer. The thickness of the HSG—Si 32 is about 200 to 2000 angstroms. The HSG—Si 32 is optionally separated along the grain boundaries to expose a portion of the second dielectric layer 30. Using a slight dry etching to etch the HSG—Si 32 can do this. A plurality of residual HSG—Si islands 32 is left on the second dielectric layer 30.

Figure 8:
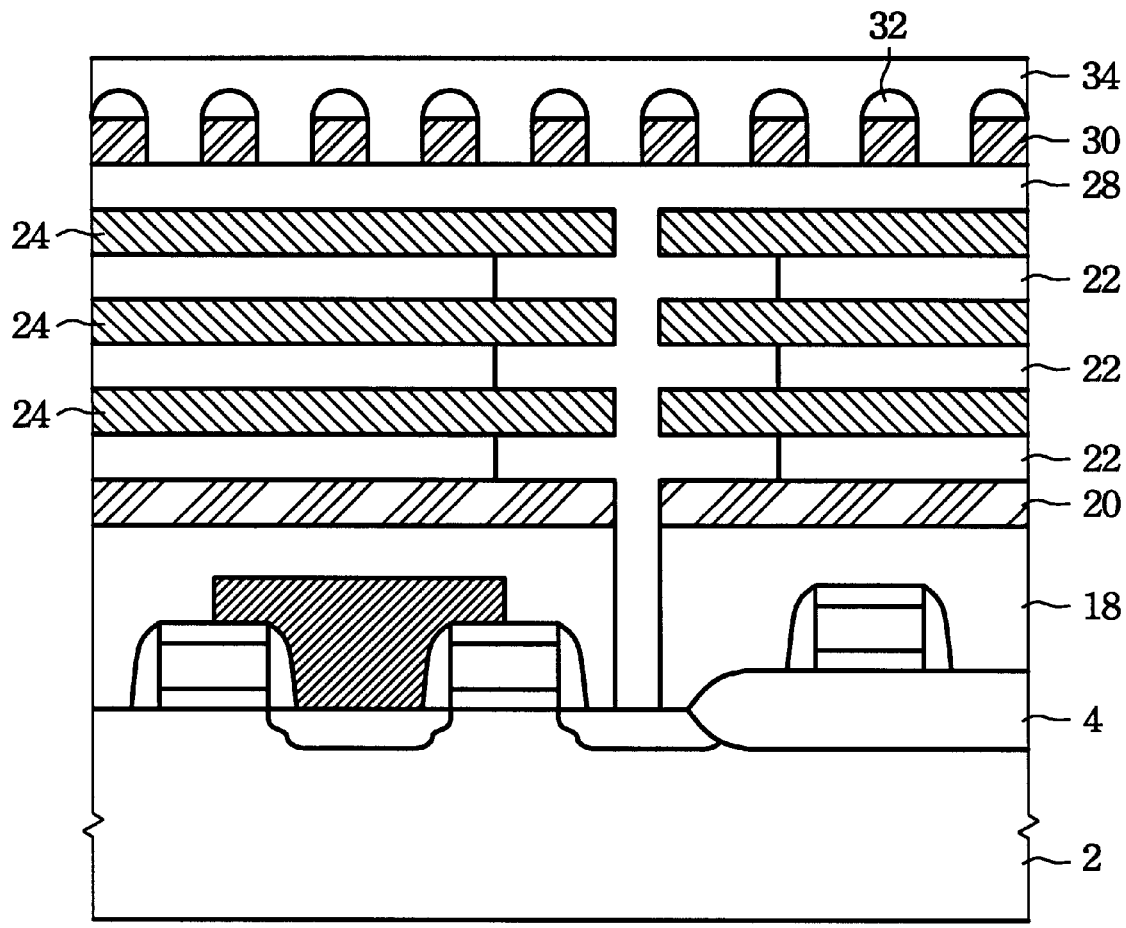
FIG. 8 is a cross-sectional view of a semiconductor wafer illustrating the step of etching the second dielectric layer using the HSG—Si as a hard mask to expose the first conductive layer and forming a second conductive layer on the first conductive layer and the HSG—Si.

Next, as shown in FIG. 8, the exposed second dielectric layer 30 is etched back using the HSG—Si 32 as a hard mask to form a plurality of pillars. A portion of the first conductive layer 28 is exposed by this step. A second conductive layer 34 is then deposited on the HSG—Si 32 and on a portion of the first conductive layer 28. The second conductive layer 34 can be formed using doped polysilicon, in-situ doped polysilicon or metal such as aluminum, copper, tungsten, titanium, silicide, PtSi, $WSi_2$, $TiSi_2$ or $CoSi_2$. Next, an etching back or a CMP process is used for planarization to expose the residual second dielectric layer.

Figure 9:
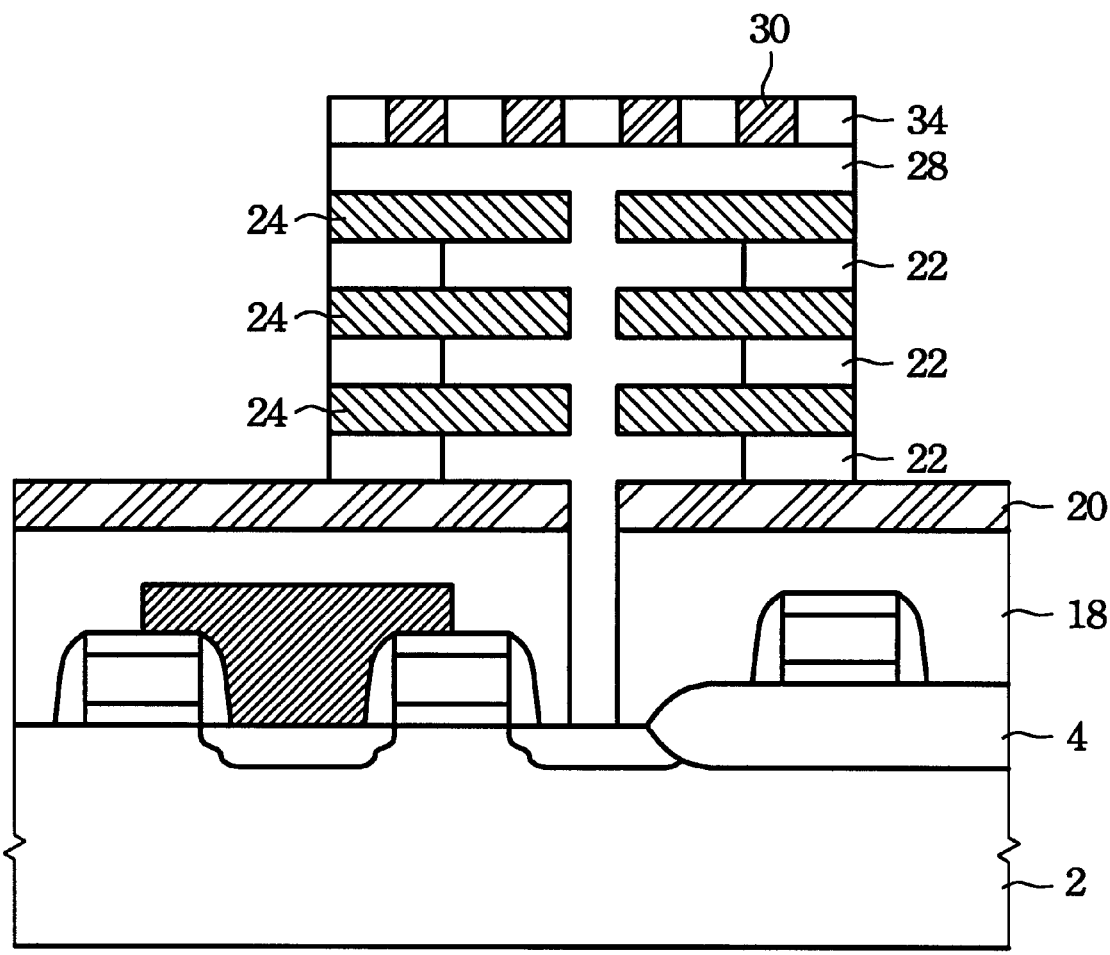
FIG. 9 is a cross-sectional view of a semiconductor wafer illustrating the step of etching the stacked layer, the first conductive layer and the second conductive layer.

Referring to FIG. 9, a second photoresist is patterned on the second conductive layer 34 to define the storage node. Similarly, dry etching is used to etch the stacked layer, the second dielectric layer 30, and the conductive layers to the surface of the nitride layer 20 and by controlling the recipe of the reaction gas. The stacked layer, the second dielectric layer 30 and the conductive layers will be etching away respectively. In preferred embodiment, the etchant of the etching is similar to the step to form the contact hole 26. The etchant to etch polysilicon is $SiCl_4/Cl_2$, $BCl_3/Cl_2$, $HBr/Cl_2$ $/O_2$, $HBr/O_2$, $Br_2/SF_6$ or $SF_6$. Then the second photoresist is removed away.

Figure 10:
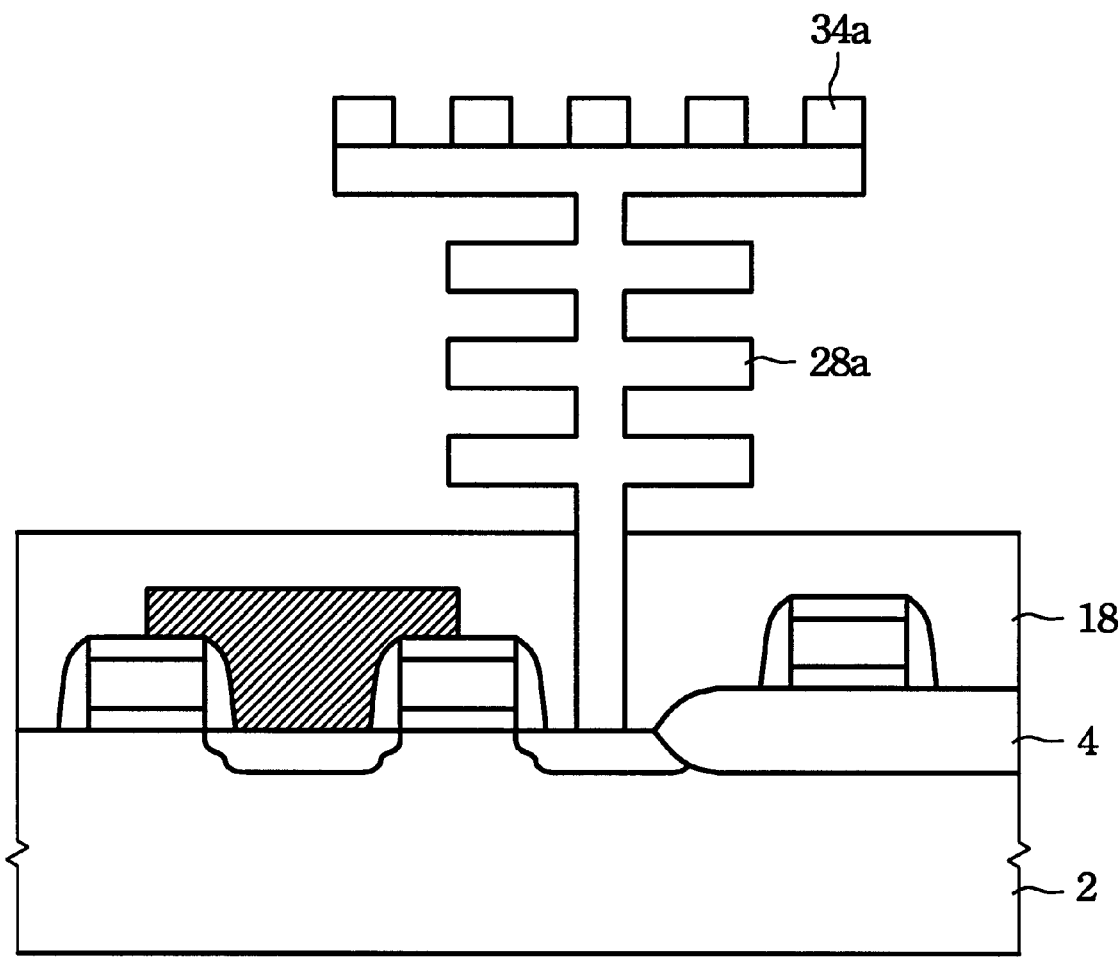
FIG. 10 is a cross-sectional view of a semiconductor wafer illustrating the step of removing the BPSG and CVD silicon dioxide stacked layers and pad nitride layer.

As be seen in FIG. 10, the BPSG layers 22, the silicon dioxide layers 24 and the second dielectric layer 30 are removed using a BOE (buffer oxide etching) solution or a diluted HF solution to form a plurality of horizontal fins 28a and a plurality of vertical pillars 34a. Further, in order to attain more surface area of the bottom storage node, the nitride layer 20 can be stripped away using hot phosphorus acid solution ($H_3PO_4$). The resulting structure is shown in FIG. 10.

Figure 11:
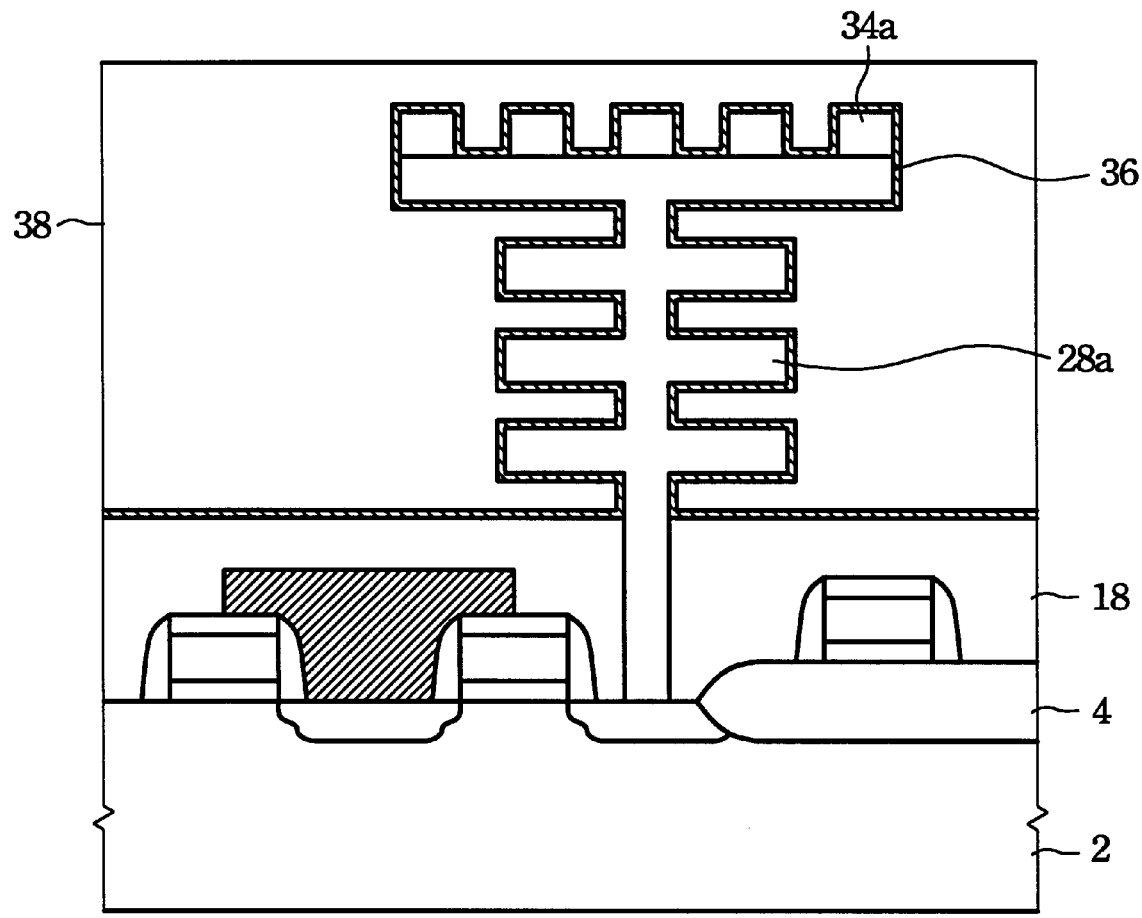
FIG. 11 is a cross-sectional view of a semiconductor wafer illustrating the step of forming a dielectric layer on the conductive layers and forming a third conductive layer on the dielectric layer.

Turning next to FIG. 11, the next step of the formation is the deposition of a thin dielectric film 36 along the surface of the first conductive layers 28a and the second conductive layers 34a. Typically, the dielectric film 36 is preferably formed of either a double film of nitride/oxide film, a triple film of oxide/nitride/oxide, or any other high dielectric film such as tantalum oxide ($Ta_2O_5$), BST, PZT, PLZT. Finally, still referred to FIG. 11, a third conductive layer 38 is deposited over the dielectric film 36, having a thickness about 500 to 10000 angstroms. The third conductive layer 38 is used as the top storage node and is formed of doped polysilicon, in-situ doped polysilicon, aluminum, copper, tungsten or titanium, silicide, PtSi, $WSi_2$, $TiSi_2$ or $CoSi_2$.

As is understood by a person that skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A method for fabricating a capacitor on a semiconductor substrate, said method comprising the steps of:

forming a stacked layer consisting of alternating BPSG layers and silicon oxide layers;

forming a contact hole in said stacked layer to said substrate;

selectively etching said stacked layer;

forming a first conductive layer in said contact hole and on said stacked layer;

forming a dielectric layer on said first conductive layer;

forming a hemispherical grain silicon (HSG—Si) on said dielectric layer to expose a portion of said dielectric layer;

etching said exposed dielectric layer using said HSG—Si as an etching mask to form a plurality of pillars composed of the residual exposed dielectric layer and to expose a portion of said first conductive layer;

forming a second conductive layer on said HSG—Si and on a portion of said first conductive layer;

performing a process for planarization to expose at least a portion of said plurality of pillars composed of said residual exposed dielectric layer;

patterning said second conductive layer to define a storage node region of said capacitor;

removing said stacked layer and said plurality of pillars composed of said residual exposed dielectric layer to form a plurality of horizontal fins and a plurality of vertical pillars at top of said plurality of horizontal fins;

forming a dielectric film along a surface of said plurality of horizontal fins and said plurality of vertical pillars; and forming a third conductive layer over said dielectric film.

2. The method according to claim 1, further comprising the following steps before forming said stacked layer:

forming a substrate-adjacent dielectric layer on said substrate; and forming a nitride layer on said substrate-adjacent dielectric layer.

3. The method according to claim 1, further comprising the step of removing said nitride layer before forming said dielectric film.

4. The method according to claim 1, wherein said BPSG layers have a thickness of about 300 to 2000 angstroms.

5. The method according to claim 1, wherein said silicon oxide layers have a thickness of about 300 to 2000 angstroms.

6. The method according to claim 1, wherein said step of selective etching said stacked layer is done with a low pressure HF vapor.

7. The method according to claim 1, wherein said first conductive layer has a thickness of about 300 to 5000 angstroms.

8. The method according to claim 1, wherein said dielectric layer is formed of BPSG.

9. The method according to claim 1, wherein said dielectric layer is formed of TEOS-oxide.

10. The method according to claim 1, wherein said dielectric layer is formed of SOG.

11. The method according to claim 1, wherein said dielectric layer has a thickness of about 500 to 3000 angstroms.

12. The method according to claim 1, further comprising a step of etching said HSG—Si to separate said HSG—Si after forming said HSG—Si.

13. The method according to claim 1, wherein said process for planarization is etching back.

14. The method according to claim 1, wherein said process for planarization is CMP.

15. The method according to claim 1, wherein said step of removing said stacked layer and said plurality of pillars composed of said residual exposed dielectric layer is done using a BOE (buffer oxide etching) solution.

16. The method according to claim 1, wherein said step of removing said stacked layer and said plurality of pillars composed of said residual exposed dielectric layer is done using a diluted HF solution.

17. The method according to claim 1, wherein said dielectric film formed along said surface of said plurality of horizontal fins and said plurality of vertical pillars is formed of tantalum oxide ($Ta_2O_5$).

18. The method according to claim 1, wherein said dielectric film formed along said surface of said plurality of horizontal fins and said plurality of vertical pillars is formed of oxide/nitride/oxide.

19. The method according to claim 1, wherein said dielectric film formed along said surface of said plurality of horizontal fins and said plurality of vertical pillars is formed of a double film of nitride/oxide film.

20. The method according to claim 1, wherein said dielectric film formed along said surface of said plurality of horizontal fins and said plurality of vertical pillars is formed of BST.

21. The method according to claim 1, wherein said dielectric film formed along said surface of said plurality of horizontal fins and said plurality of vertical pillars is formed of PZT or PLZT.

22. The method according to claim 1, wherein said first conductive layer, said second conductive layer, and said third conductive layer are selected from the group of doped polysilicon, in-situ doped polysilicon, aluminum, copper, tungsten, and titanium.

23. The method according to claim 2, wherein said substrate-adjacent dielectric layer is formed of silicon oxide.

24. The method according to claim 2, wherein said substrate-adjacent dielectric layer has a thickness of about 2000 to 10000 angstroms.

25. The method according to claim 1, wherein said third conductive layer has a thickness of about 500 to 10000 angstroms.

26. A method for forming a multiple fin-pillar capacitor, said method comprising the steps of:

forming a stacked layer consisting of alternating BPSG layers and silicon oxide layers on a substrate;

forming a contact hole in said stacked layer to said substrate;

using high selective etching to etch said BPSG layer;

forming a first conductive layer in said contact hole and on said stacked layer;

forming a dielectric layer on said first conductive layer;

forming a hemispherical grain silicon (HSG—Si) on said dielectric layer to expose a portion of said dielectric layer;

etching said exposed dielectric layer using said HSG—Si as an etching mask to form a plurality of pillars composed of the residual exposed dielectric layer and to expose a portion of said first conductive layer;

forming a second conductive layer on said HSG—Si and on a portion of said first conductive layer;

performing a process for planarization to expose at least a portion of said plurality of pillars composed of said residual exposed dielectric layer;

patterning said second conductive layer to define a storage node region of said capacitor;

removing said stacked layer and said plurality of pillars composed of said residual dielectric layer to form a plurality of horizontal fins and a plurality of vertical pillars at top of said plurality of horizontal fins;

forming a dielectric film along a surface of said plurality of horizontal fins and said plurality of vertical pillars; and forming a third conductive layer on said dielectric film.

27. The method according to claim 26, wherein said step of selectively etching said BPSG layer is done with a low pressure HF vapor.

28. The method according to claim 26, further comprising a step of etching said HSG—Si to separate said HSG—Si after forming said HSG—Si.

29. The method according to claim 26, wherein said dielectric layer has a thickness of about 500 to 3000 angstroms.

* * * * *